(12) United States Patent
Kung et al.

(10) Patent No.: US 11,762,417 B2
(45) Date of Patent: Sep. 19, 2023

(54) OPTICAL FILM AND DISPLAY MODULE HAVING THE SAME

(71) Applicant: AU OPTRONICS CORPORATION, Hsin-Chu (TW)

(72) Inventors: Shu-Cheng Kung, Hsin-Chu (TW); Ken-Yu Liu, Hsin-Chu (TW); Kuan-Yu Tung, Hsin-Chu (TW)

(73) Assignee: AU OPTRONICS CORPORATION, Hsin-Chu (TW)

( * ) Notice: Subject to any disclaimer, the term of this patent is extended or adjusted under 35 U.S.C. 154(b) by 392 days.

(21) Appl. No.: 17/090,946

(22) Filed: Nov. 6, 2020

(65) Prior Publication Data

US 2021/0240222 A1    Aug. 5, 2021

(30) Foreign Application Priority Data

Jan. 31, 2020   (TW) ................. 109103008

(51) Int. Cl.
*G02B 1/118*     (2015.01)
*G06F 1/16*      (2006.01)

(52) U.S. Cl.
CPC ............ *G06F 1/1609* (2013.01); *G02B 1/118* (2013.01)

(58) Field of Classification Search
CPC .... G06F 1/1609; G06F 1/1607; G06F 1/1603; G06F 1/1605; G06F 1/1601; G06F 1/16; G02B 1/118; G02B 1/11; G02B 1/14; G02B 1/16; G02B 1/18; G02B 1/10; G02B 5/021; G02B 5/0221
See application file for complete search history.

(56) References Cited

U.S. PATENT DOCUMENTS

| | | | |
|---|---|---|---|
| 7,341,355 B2 | 3/2008 | Namioka et al. | |
| 10,365,408 B2 | 7/2019 | Tung et al. | |
| 2016/0170514 A1* | 6/2016 | Jeon | G06F 3/041 |
| | | | 345/173 |
| 2019/0004213 A1* | 1/2019 | Tung | G02B 5/0221 |

FOREIGN PATENT DOCUMENTS

| | | |
|---|---|---|
| CN | 1580831 A | 2/2005 |
| CN | 107728237 A | 2/2018 |
| TW | 1265307 | 11/2006 |
| WO | 2003060573 A2 | 7/2003 |

OTHER PUBLICATIONS

The CNIPA has issued the Office Action for the corresponding China application dated Dec. 27, 2021.

* cited by examiner

*Primary Examiner* — Stephone B Allen
*Assistant Examiner* — Adam W Booher
(74) *Attorney, Agent, or Firm* — WPAT, P.C

(57) ABSTRACT

An optical film includes a rough surface having multiple measuring points constituting multiple virtual measuring planes in a given unit measuring area. A normal to each virtual measuring plane has an angle with a normal to a reference plane. On the reference plane, the projection area of the virtual measuring planes having the angle larger than 20 degrees ranges from 31% to 60% of the projection area of the given unit measuring area. The projection area of the virtual measuring planes having the angle larger than 50 degrees is less than 7% of the projection area of the given unit measuring area. 25% of the measuring points has the height larger than a first height. 75% of the measuring points has the height larger than a second height. The first height and the second height have a difference not less than 0.6 μm and not larger than 2.5 μm.

15 Claims, 10 Drawing Sheets

OPTICAL FILM AND DISPLAY MODULE HAVING THE SAME

BACKGROUND OF THE INVENTION

1. Field of the Invention

The invention generally relates to an optical film. Particularly, the invention relates to an anti-glare optical film and a display module having the optical film.

2. Description of the Prior Art

Flat and curved display modules have been widely applied to various electronic devices, such as mobile phones, wearable devices, televisions, host computers for transportation equipment, personal computers, digital cameras, handheld video games, and the like. However, in order to enhance the visual perception of the user, manufacturers are still continuously improving the optical performance of the display module.

For example, the display surface of some display modules may produce glare due to external ambient light during use. In most use conditions, glare often causes visual discomfort for some users and affects the optical performance of the displayed image. In order to solve this problem, some conventional display modules add a high-haze layer with a rough surface on the display surface to reduce glare. However, when increasing the haze and roughness of the anti-glare film to reduce glare, there will still be residual light source reflections, which will affect the reading experience. In addition, when measuring the energy distribution reflected from the surface of the anti-glare film, the uneven distribution of energy with central high energy will affect the reading comfort.

SUMMARY OF THE INVENTION

It is an object of the invention to provide an optical film and a display module having the optical film, which has a rough surface with a specific proportion of middle-angle inclined structures to effectively provide the anti-glare effect.

It is another object of the invention to provide an optical film and a display module having the optical film, which has a uniform distribution of energy on the rough surface to provide the reading comfort.

In an embodiment, the invention provides and optical film including a rough surface defining a reference plane, in a given unit measuring area, the rough surface having a plurality of measuring points constituting a plurality of virtual measuring planes, a normal to each of the virtual measuring planes having an angle included with a normal to the reference plane, each of the measuring points having a height from the reference plane, wherein on the reference plane, a projection area of the virtual measuring planes having the angle larger than 20 degrees ranges from 31% to 60% of a projection area of the given unit measuring area, and a projection area of the virtual measuring planes having the angle larger than 50 degrees is less than 7% of the projection area of the given unit measuring area, and wherein 25% of the measuring points has the height larger than a first height, 75% of the measuring points has the height larger than a second height, and the height difference between the first height and the second height is equal to or larger than 0.6 μm and smaller than or equal to 2.5 μm.

In an embodiment, the given unit measuring area has a plurality of rough structures. The plurality of rough structures include a highest structure. Within a range of 1 μm below the highest structure, a projection area of the virtual measuring planes having the angle larger than 27 degrees is less than 18% of the projection area of the given unit measuring area on the reference plane. Within the range of 1 μm below the highest structure, a projection area of the rough structures is equal to or larger than 30% of the projection area of the given unit measuring area on the reference plane.

In an embodiment, the given unit measuring area is an area of 92.2 μm×69.1 μm, and the number of the measuring points is 1024×768.

In an embodiment, the optical film further includes an anti-reflective layer disposed on the rough surface.

In an embodiment, the optical film further includes an anti-fingerprint film disposed on the anti-reflective layer.

In another embodiment, the invention provides a display module including a display panel having a display surface and the optical film described above. The optical film is disposed on the display panel with the rough surface away from the display surface.

Compared to the prior art, the optical film of the invention not only presents a concave and convex rough surface to improve the anti-glare performance, but also has a mid-angle inclined structure design that can effectively destroy the shape of light spots, and make the surface-reflected energy distribution more uniform, effectively improving the reading comfort. The optical film of the invention further restricts the area proportion of structures having larger tilt angle to have more support, thereby enhancing the anti-scratch ability of the optical film, and reducing the possibility of film damage.

DETAILED DESCRIPTION OF THE PREFERRED EMBODIMENT

Figure 1:
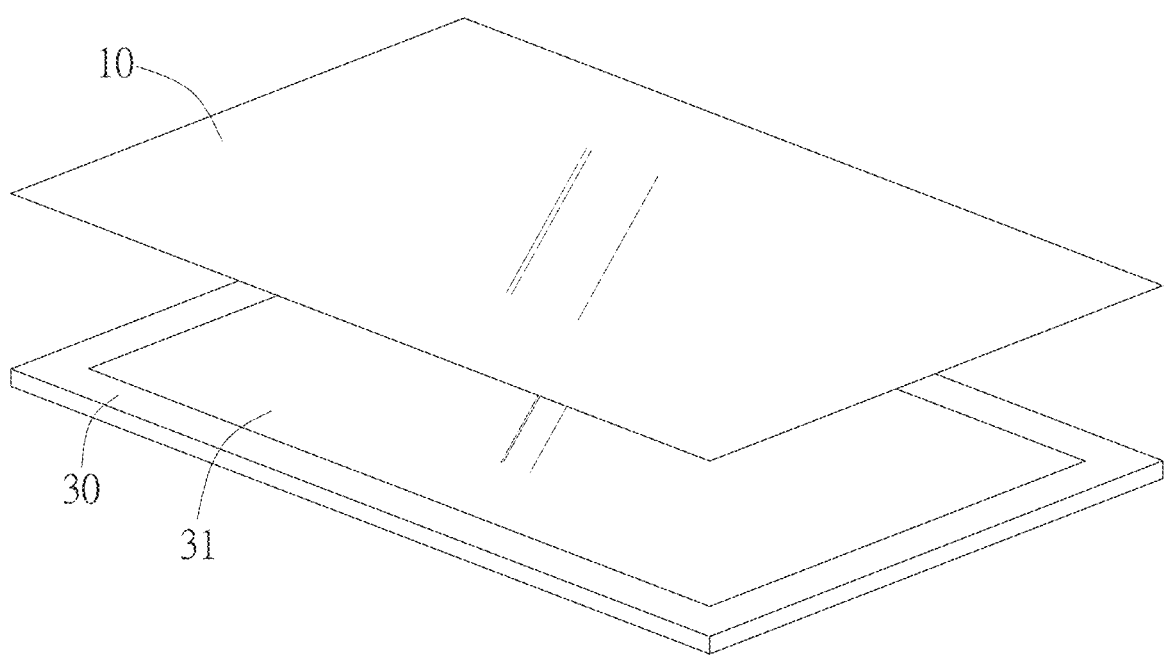
FIG. 1 is a schematic view of an embodiment of the display module of the invention.
Figure 1:
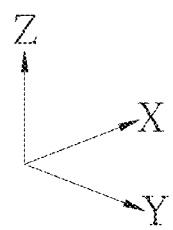

In the drawings, the thickness of layers, films, panels, regions, etc., are exaggerated for clarity. Like reference numerals designate like elements throughout the specification. It will be understood that when an element such as a layer, film, region, or substrate is referred to as being "on" or "connected to" another element, it can be directly on or connected to the other element or intervening elements may also be present. In contrast, when an element is referred to as being "directly on" or "directly connected to" another element, there are no intervening elements present. As used herein, a "connection" may be a physical and/or electrical connection. In addition, an "electrical connection" or "coupling" means that other elements may exist therebetween.

It should be understood that, even though the terms such as "first", "second", "third", . . . , may be used to describe an element, a part, a region, a layer and/or a portion in the present specification, but these elements, parts, regions, layers and/or portions are not limited by such terms. Such terms are merely used to differentiate an element, a part, a region, a layer and/or a portion from another element, part, region, layer and/or portion. Therefore, in the following discussions, a first element, portion, region, layer or portion may be called a second element, portion, region, layer or portion, and do not depart from the teaching of the present disclosure.

The term used herein is only for the purpose of describing specific embodiments and is not restrictive. As used herein, unless the content clearly indicates otherwise, the singular forms "a", "an" and "the" are intended to include the plural forms, including "at least one." "Or" means "and/or". As used herein, the term "and/or" includes any and all combinations of one or more of the related listed items. It should also be understood that when used herein, the terms "including" and/or "including" designate the presence of the features, regions, steps, operations, elements, and/or components, but do not exclude the existence or addition of one or more other features, regions, steps, operations, elements, components, and/or combinations thereof.

In addition, the relative terms such as "below" or "bottom" and "above" or "top" may be used herein to describe the relationship of one element to another, as illustrated. It will be understood that the relative terms are intended to encompass different orientations of the device in addition to the orientation shown in the drawings. For example, if the device in the drawings is turned over, the elements described as being "below" the other elements will be oriented on the "upper" side of the other elements. Therefore, the exemplary term "below" may encompass the orientation of "below" and "above" depending on the particular orientation of the drawing. Similarly, if the device in the drawings is turned over, the elements described as being "above" the other elements will be oriented on the "lower" side of the other elements. Therefore, the exemplary term "above" may encompass the orientation of "above" and "below" depending on the particular orientation of the drawing.

"About", "approximately" or "substantially" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, ±20%, ±10%, ±5% of the stated value. Moreover, "about", "approximately" or "substantially" as used herein may select a more acceptable range of deviation or standard deviation depending on optical properties, etching properties, or other properties, without applying a standard deviation for all properties.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the claims.

The invention provides an optical film and a display module having the optical film. The display module can be applied to various display devices, such as computer display, television, monitor, vehicle host computer, and the like. Moreover, the display module can be applied as the display of the display module of other electronic devices, such as mobile phone, digital camera, handheld video game.

As shown in FIG. 1, in an embodiment, the display module 1 includes an optical film 10 and a display panel 30. The display panel 30 has a display surface 31, and the optical film 10 is disposed on the display surface 31. In a preferred embodiment, the optical film 10 can provide the anti-glare effect. The display panel 30 is preferably a liquid crystal display panel, which can display image in cooperation with a backlight module (not shown). In another embodiment, the display panel 30 can be a self-luminous display panel such as organic light-emitting diode display panel, or other suitable display panels such as electrophoretic display panel.

Figure 2:
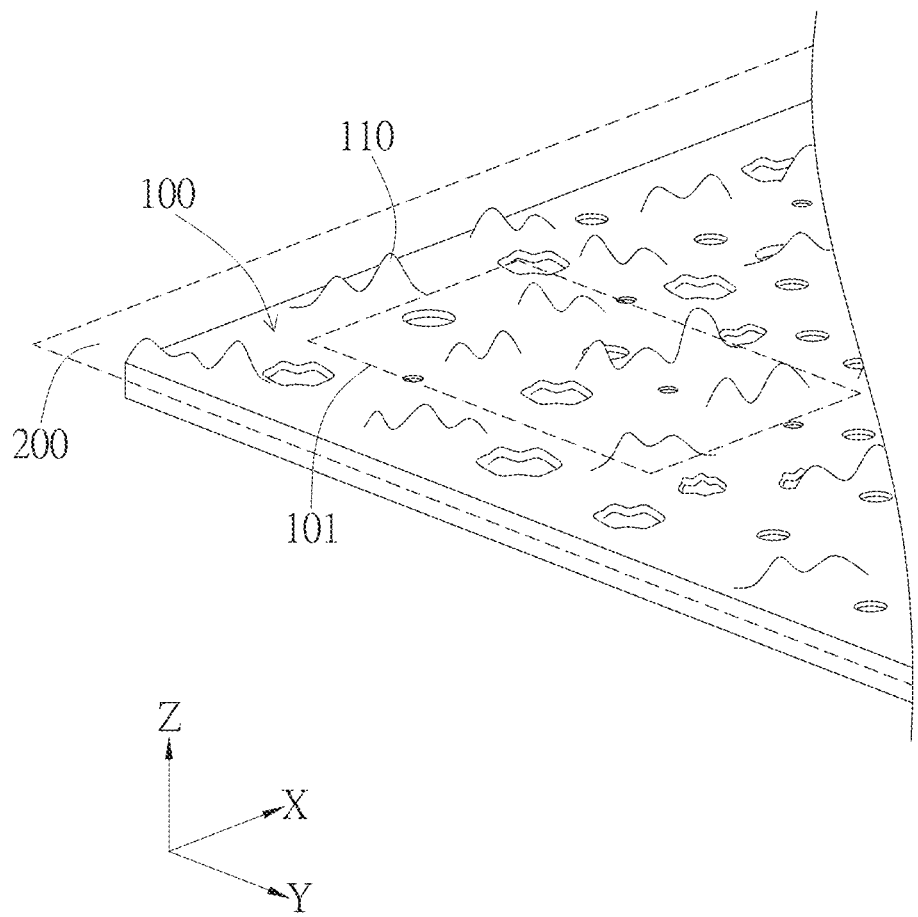
FIG. 2 is a partially enlarged view of an embodiment of the optical film of the invention.
Figure 3:
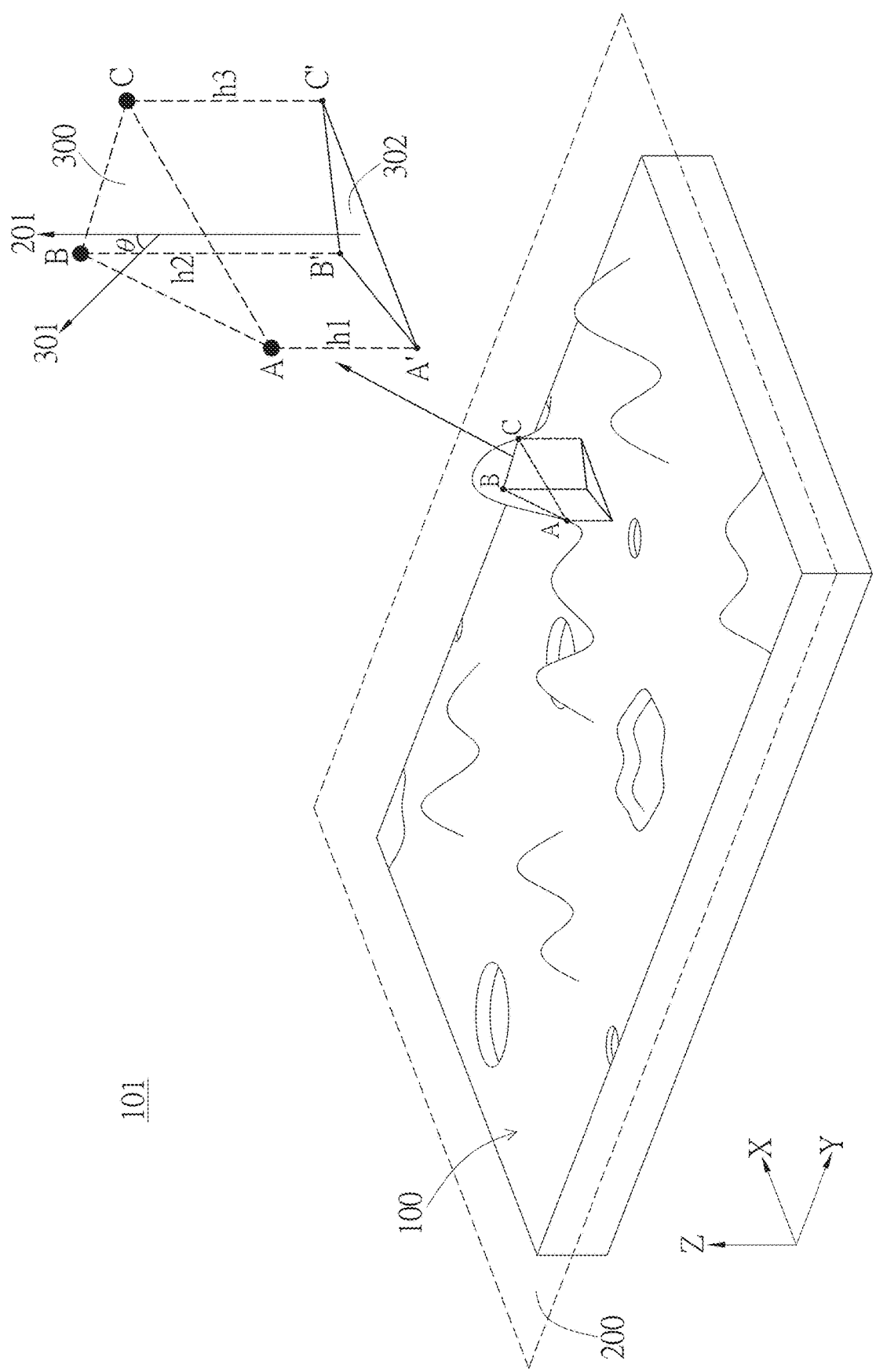
FIG. 3 is a schematic view of the given unit measuring area of FIG. 2.

Referring to FIG. 2 and FIG. 3, in an embodiment, the optical film 10 includes a rough surface 100. When the optical film 10 is disposed on the display surface 31, the rough surface 100 is away from the display surface 31. The rough surface 100 is constituted by a plurality of rough structures 110, which are distributed on the surface of the optical film 10. The rough structures 110 create a plurality of bumps and pits on the rough surface 100. In other words, the surface of the rough structures 110 is the rough surface 100. In an embodiment, the optical film 10 includes a material such as glass, polymer (e.g. polyethylene terephthalate, PET), but not limited thereto. In an embodiment, the rough surface 100 can be formed by phase separation technology, such as thermally induced phase separation, vapor induced phase separation, dry etching, wet etching, and the like.

The rough surface 100 defines a reference plane 200. In an embodiment, the reference plane 200 is parallel to the plane along which the optical film 10 extends, such as XY plane. In an embodiment, when the display surface 31 of the display panel 30 is a flat plane, the reference plane 200 is substantially parallel to the display surface 31. In an embodiment, the reference plane 200 is preferably a plane on which the lowest point of the rough surface 100 is located. For example, the reference plane 200 can be a tangent plane parallel to the XY-plane at the lowest point of the rough structures 110.

As shown in FIG. 2 and FIG. 3, in a given unit measuring area 101, the rough surface 100 has a plurality of measuring points (e.g. A, B, C). In an embodiment, the given unit measuring area 101 can be an area of 92.2 μm×69.1 μm, and the number of the measuring points is 1024×768. In other words, the projection area of the given unit measuring area 101 on the reference plane 200 is approximately 92.2 μm×69.1 μm. For example, on the plane where the optical film 10 extends (e.g. XY plane), any unit measuring area 101 of the rough surface 100 can have a length of about 92.2 μm in one dimension (e.g. Y axis direction) with about 1024 measuring points along the length direction and a width of about 69.1 μm in the other dimension (e.g. X axis direction) with 768 measuring points along the width direction, but not limited thereto. In this embodiment, the rough surface 100 of the optical film 10 can be analyzed and measured by laser scanning microscopes (e.g. Keyence, VK-X200), but not limited thereto. In other embodiments, the size or shape of the given unit measuring area 101 of the rough surface 100 and the number of the measurement points can be modified according to the measurement equipment, which preferably has a resolution of 1024×768 or higher for the unit measuring area 101 (e.g. an area of about 92.2 μm×69.1 μm).

In the given unit measuring area 101, the plurality of measuring points constitute a plurality of virtual measuring planes 300. Specifically, for the 1024×768 measuring points, every three adjacent measuring points constitute one triangular virtual measuring plane, and the virtual measuring planes do not overlap with one another. For example, three adjacent measuring points A, B, and C on the rough surface 100 can constitute one triangular virtual measuring plane 300, and the three measuring points A, B, and C are three vertices of the triangular virtual measuring plane 300, respectively. The normal 301 to each of the virtual measuring planes 300 has an angle θ with the normal 201 to the reference plane 200. The angle θ included between the normal 301 to the virtual measuring plane 300 and the normal 201 to the reference plane 200 can be considered as the tilt (or inclined) angle of the virtual measuring plane 300.

Moreover, each of the measuring points has a height from the reference plane 200 (e.g. h1, h2, h3). For example, the three measuring points A, B, and C are vertically projected on the reference plane 200 to form corresponding projection points A', B', and C', respectively. The distance between each measuring point and its corresponding projection point is the height with respect to the reference plane 200. For example, The heights of the measuring points A, B, and C with respect to the reference plane 200 are h1, h2, and h3, respectively, and the height of the measuring point in the reference plane 200 (i.e., the lowest point of the rough surface 100) is zero.

On the reference plane 200, the projection area of the given unit measuring area 101 is the area of the given unit measuring area 101, such as 92.2 μm×69.1 μm. The projection area of each virtual measuring plane 300 is the area enclosed by the corresponding projection points on the reference plane 200. For example, the projection area of the triangular virtual measuring plane 300 constituted by the measuring points A, B, and C corresponds to the area of the projection region 302 defined by the projection points A', B', and C'.

In this embodiment, on the reference plane 200, the projection area of the virtual measuring planes 300 having the angle θ larger than 20 degrees preferably ranges from 31% to 60% of the projection area of the given unit measuring area 101. In other words, among the plurality virtual measuring planes constituted by the plurality of measuring points, the total projection area of the virtual measuring planes having the tilt angle θ larger than 20 degrees on the reference plane 200 is preferably equal to or larger than 31% of the projection area of the given unit measuring area 101 and smaller than or equal to 60% of the projection area of the given unit measuring area 101 on the reference plane 200, such as between 92.2 μm×69.1 μm×31% and 92.2 μm×69.1 μm×60%. As such, the rough surface 100 has a certain degree of portions with tilt angle θ larger than 20 degrees to ensure the anti-glare ability of the optical film 10, and the rough surface 100 is not too flat or smooth to cause insufficient anti-glare ability.

In addition, on the reference plane 200, the projection area of the virtual measuring planes 300 having the angle θ larger than 50 degrees is preferably less than 7% of the projection area of the given unit measuring area 101. In other words, among the plurality virtual measuring planes constituted by the plurality of measuring points, the total projection area of the virtual measuring planes having tilt angle θ larger than 50 degrees on the reference plane 200 is preferably smaller than 7% of the projection area of the given unit measuring area 101, such as smaller than 92.2 μm×69.1 μm×7%. As such, the rough surface 100 will not have excessive columnar structures constituted by portions having tilt angle θ larger than 50 degrees to cause insufficient light scattering.

Figure 4:
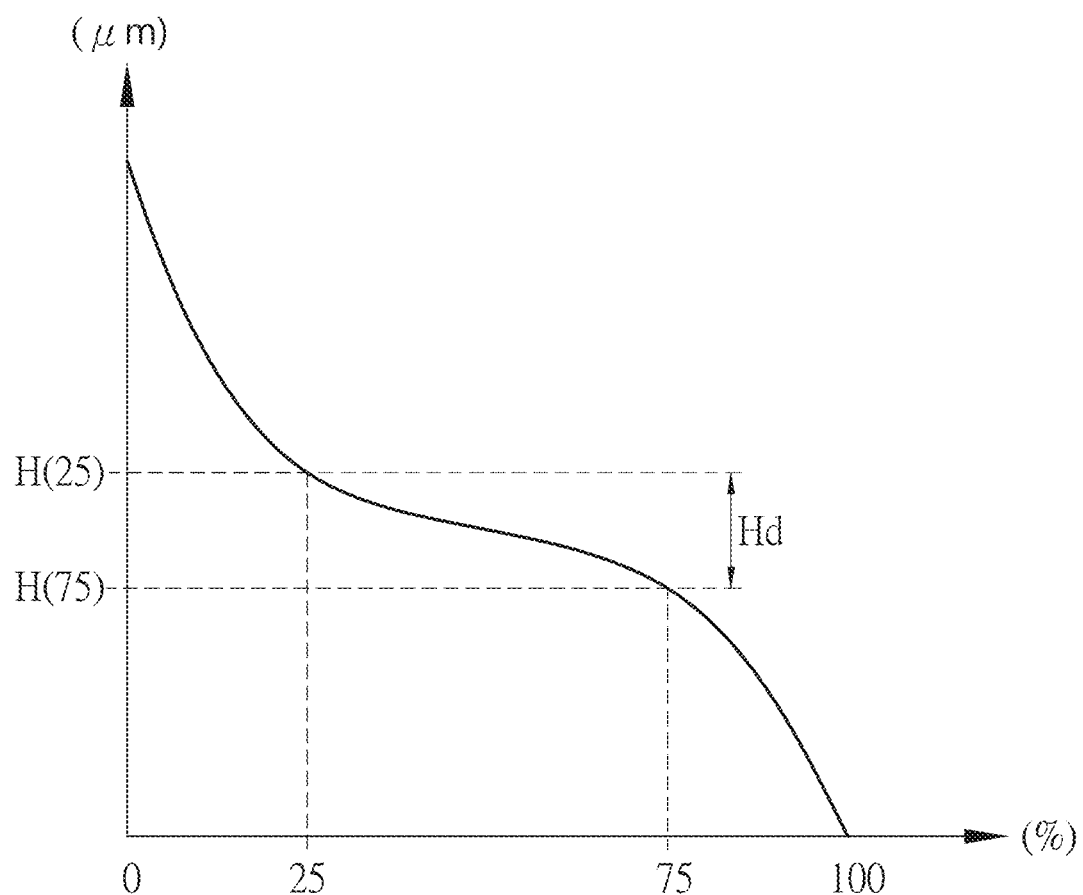
FIG. 4 is a schematic view showing the statistical analysis of the heights of the measuring points of the optical film of the invention.

As shown in FIG. 4, in the given unit measuring area 101, the heights of the measuring points with respect to the reference plane 200 is statistically analyzed to form the curve, wherein the Y-axis represents the height of the measuring point with respect to the reference plane 200, and the X-axis represents the percentage of the measuring points at a corresponding height. For example, in the Z axis direction of the optical film 10, the lowest measuring point of the rough surface 100 has a minimum value of height, i.e., the height at the lowest measuring point is zero with respect to the reference plane 200, and the percentage of the measuring points having the height equal to or larger than the minimum value (e.g. zero) is 100%. In other words, the heights of all measuring points are equal to or larger than zero. Similarly, the highest measuring point of the rough surface 100 has a maximum value of height, and the percentage of the measuring points having the height larger than the maximum value is 0%. In other words, no measuring point will have a height larger than the maximum value. In this embodiment, the portions with extreme height value (for example, too low or too high) in the rough surface 100 are neglected to explore the height difference of the portions with intermediate height value and optimize the surface topography. In this embodiment, 25% of the measuring points has the height larger than a first height H(25%); 75% of the measuring points has the height larger than a second height H(75%). The height difference (Hd) between the first height H(25%) and the second height H(75%) is preferably equal to or larger than 0.6 μm and smaller than or equal to 2.5 μm. In an embodiment, by setting parameters of the laser scanning microscope (e.g. Keyence, VK-X200), the curve of FIG. 4 can be obtained, and the parameter for height difference, such as Rδc (i.e., Rδc=Hd), between the first height H(25%) and the second height H(75%) can be further obtained. As such, the measuring points having the height in the middle 50% can have a proper height drop, and a preferable topography can be obtained.

Referring to Table 1, Table 1 shows the test results of three embodiments and two comparative embodiments. In Embodiments 1-3, the rough surface in the given unit measuring area has the following features: (1) on the reference plane, the projection area of the virtual measuring planes having the (tilt) angle larger than 20 degrees ranges from 31% to 60% of the projection area of the given unit measuring area, (2) the projection area of the virtual measuring planes having the (tilt) angle larger than 50 degrees is less than 7% of the projection area of the given unit measuring area, and (3) 25% of the measuring points has the height larger than the first height, 75% of the measuring points has the height larger than a second height, and the height difference (e.g. Rδc) between the first height and the second height is equal to or larger than 0.6 μm and smaller than or equal to 2.5 μm. After the test of human factors, the optical films of Embodiments 1-3 having the rough surface designed as above can effectively destroy the shape of light spots and achieve a good anti-glare performance. In Comparative Embodiment 1, the projection area of the virtual measuring planes having the (tilt) angle larger than 20 degrees is less than 31% of the projection area of the given unit measuring area, and the Rδc is less than 0.6 μm. Accordingly, the difference among the rough structures is relatively small, impairing the anti-glare performance. In Comparative Embodiment 2, the projection area of the virtual measuring planes having the (tilt) angle larger than 50 degrees is larger than 7% of the projection area of the given unit measuring area. Accordingly, the rough surface of Comparative Embodiment 2 exhibits excessive column-like structures, impairing the anti-glare performance.

TABLE 1

|  |  | Embodiment 1 | Embodiment 2 | Embodiment 3 | Comparative Embodiment 1 | Comparative Embodiment 2 |
| --- | --- | --- | --- | --- | --- | --- |
| angle (%) | >20(%) | 31.5 | 59.1 | 58.2 | 27.6 | 61.6 |
|  | >50(%) | 0.01 | 0.16 | 6.6 | 0.01 | 11.0 |
| Rδc(μm) |  | 0.6 | 0.7 | 2.5 | 0.4 | 1.2 |
| Anti-Glare performance |  | ○ | ○ | ○ | X | X |

As shown in Table 2, Table 2 shows the roughness (Ra), the haze, and the gloss at 20, 60, and 80 degrees (e.g. Gloss (20), Gloss (60), Gloss (80), unit: GU). As shown in Table 2, the anti-glare performance is not absolutely associated with roughness, haze, and gloss. For example, although the haze in Embodiment 1 is low, while the haze in Comparative Embodiments 1-2 is high, in terms of anti-glare performance, Embodiment 1 is better than Comparative Embodiments 1-2.

TABLE 2

|  | Embodiment 1 | Embodiment 2 | Embodiment 3 | Comparative Embodiment 1 | Comparative Embodiment 2 |
| --- | --- | --- | --- | --- | --- |
| Ra | 0.36 | 0.36 | 1.43 | 0.25 | 0.64 |
| Haze | 34 | 65 | 88 | 45 | 82 |
| Gloss(20) | 13.1 | 0.4 | 0.2 | 8.4 | 1.6 |
| Gloss(60) | 31 | 4.3 | 1.4 | 20.6 | 16.4 |
| Gloss(80) | 54.5 | 45.9 | 2.6 | 6.8 | 33.9 |
| Anti-Glare performance | ○ | ○ | ○ | X | X |

Figure 5:
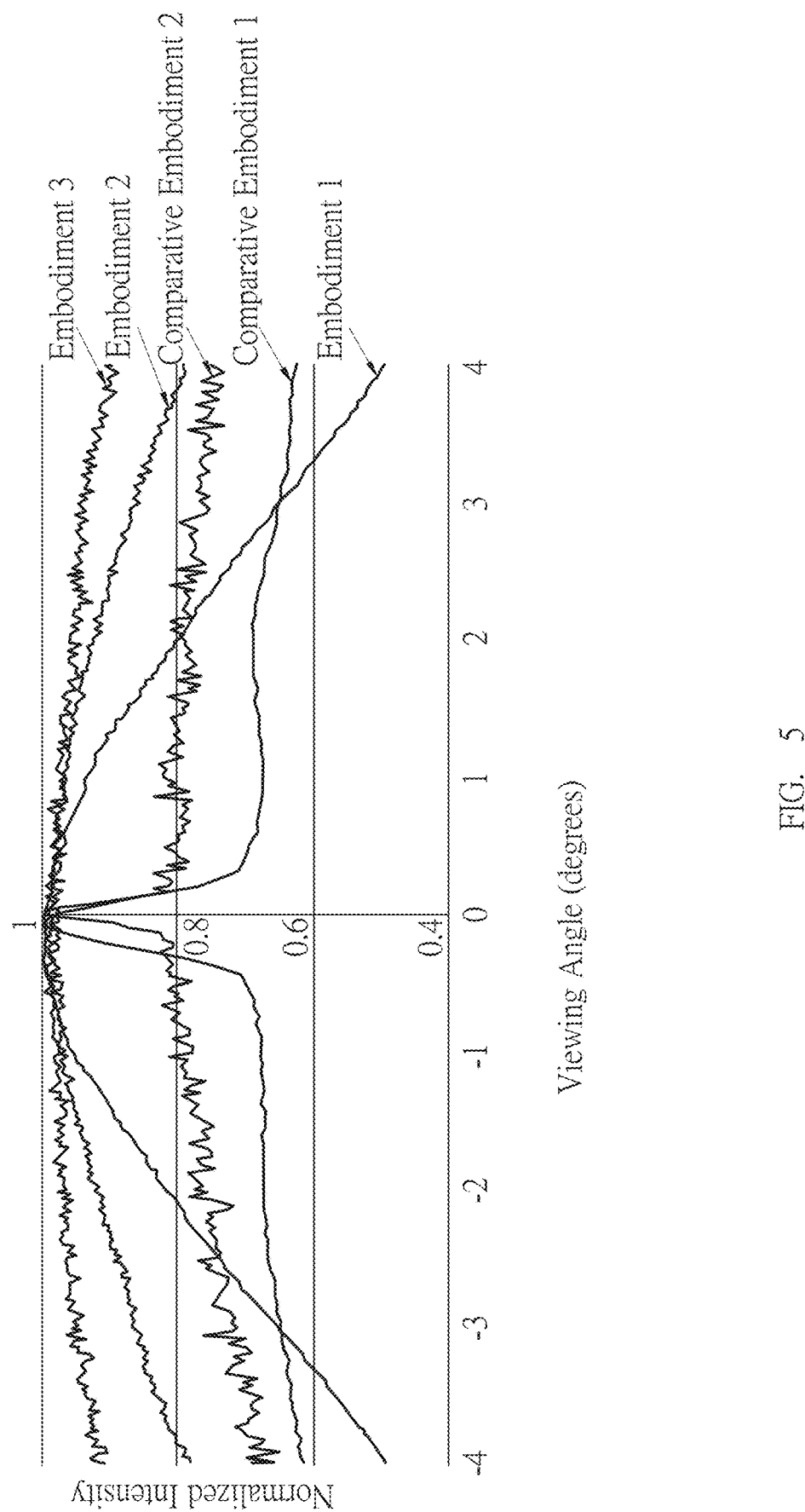
FIG. 5 shows the energy distribution reflected from the optical films of different embodiments and comparative embodiments.

Referring to FIG. 5, FIG. 5 shows the normalized intensity curves of Embodiments 1-3 and Comparative Embodiments 1-2, which represent the energy distribution reflected from the rough surface at different viewing angles. The normalized intensity curves are wider as the haze is increased, so that the light can be much scattered, and when the light is focused at the center, the reading comfort will be impaired. As shown in FIG. 5, Embodiments 1-3 have the rough surfaces with the designed angle distribution and Rδc, the normalized intensity curves thereof exhibit different distributions without light focused at the center, so that the energy distribution is more uniform, and a more comfortable reading experience can be obtained. In contrast, in the Comparative Embodiments 1-2, the energy distributions thereof exhibit that light is focused at the center, resulting in reading discomfort.

Table 3 shows the test results of another two comparative embodiments (Comparative Embodiments 3-4). In Comparative Embodiment 3, the rough surface thereof complies with the features (1) and (2) described above, but the Rδc is too low, and in Comparative Embodiment 4, the rough surface thereof does not comply with the features (1) and (2) described above even though the Rδc falls in the defined range. After the test of human factors, the optical films of Comparative Embodiments 3-4 cannot effectively destroy the shape of light spots, so that the anti-glare performance is impaired.

TABLE 3

|  |  | Comparative Embodiment 3 | Comparative Embodiment 4 |
| --- | --- | --- | --- |
| angle (%) | >20 (%) | 32.3 | 77.8 |
|  | >50 (%) | 2.3 | 18.2 |
| Rδc(μm) |  | 0.30 | 2.3 |
| haze |  | 54 | 14 |
| Anti-Glare performance |  | X | X |

Figure 6:
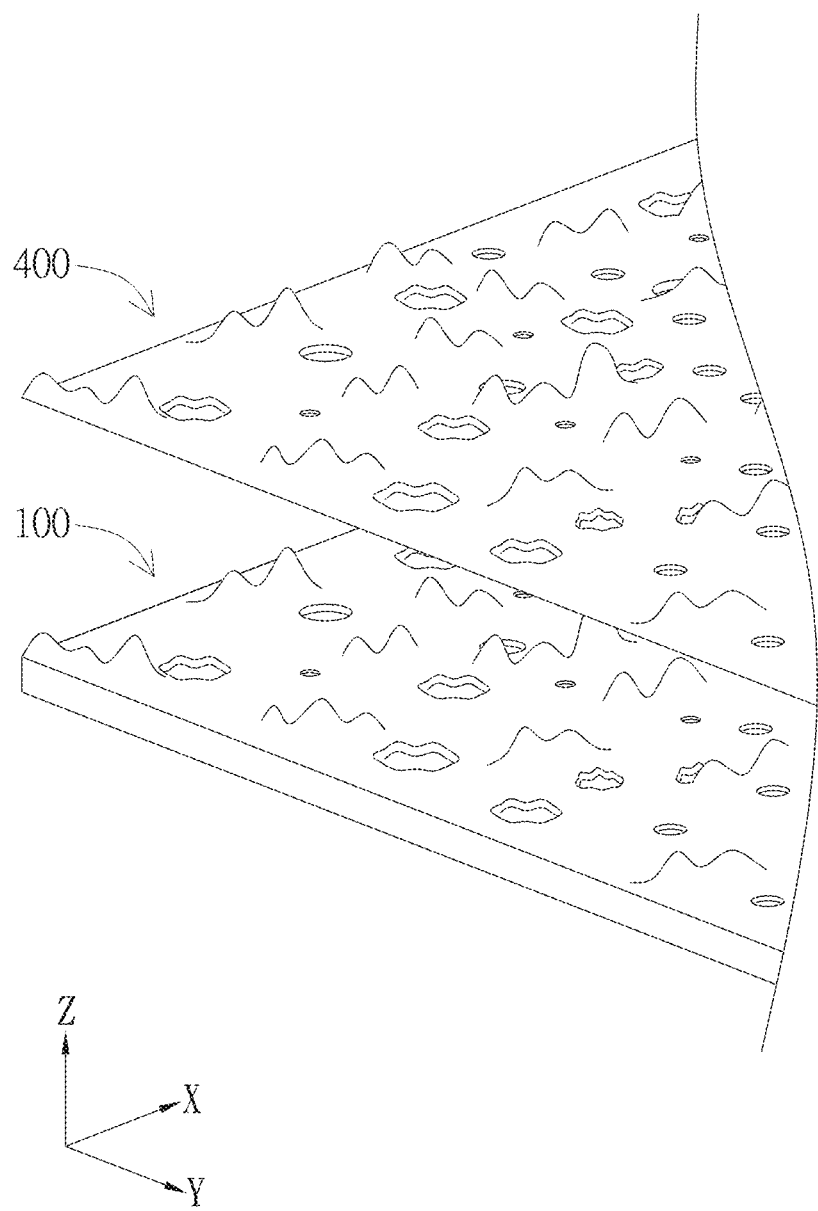
FIG. 6 is a partially enlarged view of another embodiment of the optical film of the invention.

In another embodiment, as shown in FIG. 6, the optical film can further include an anti-reflective layer 400 disposed on the rough surface 100. In an embodiment, the anti-reflective layer 400 can be made of metal oxides or any suitable materials. In an embodiment, the reflectivity of the anti-reflective layer 400 is preferably less than 1%, but not limited thereof. The anti-reflective layer 400 can be formed on the rough surface 100 by coating, plating, or any suitable processes and have a surface structure conformal to the rough surface 100. The surface topography of the optical film with the anti-reflective layer 400 is substantially the same as that of the optical film without the anti-reflective layer 400. In other words, in the embodiment that the optical film having the anti-reflective layer 400 on the rough surface 100, the surface design of the optical film will comply with the features (1)-(3) to effectively provide the anti-glare effect and to improve the reading comfort.

Moreover, the optical film can be further designed to define the area of the rough structures having larger tilt angle at a specific range to enhance the anti-scratch effect and further to reduce the possibility of film damage. Specifically, the anti-scratch test is performed on the rough structures in the given unit measuring area, which is lower than the highest rough structure by a predetermined distance, and the topography of the rough structures lower than the highest rough structure beyond the predetermined distance can be considered as a flat plane. The "predetermined distance" refers to the distance between the rough structures with topography that affects the anti-scratch effect of the optical film and the highest point of the highest rough structure, and the topography within the range of the predetermined distance represents the support surface. For example, according to JIS-5600 standards, the anti-scratch anility of the optical film is substantially determined by the topography (support surface) of the rough structures within 1 µm below the highest point of the highest structure, so that the "predetermined distance" can be substantially set as 1 µm. In other words, in the anti-scratch test, the reference plane is preferably the plane which is different from the highest point of the highest structure by the predetermined distance, and the structures below the reference plane are considered flat.

Figure 7:
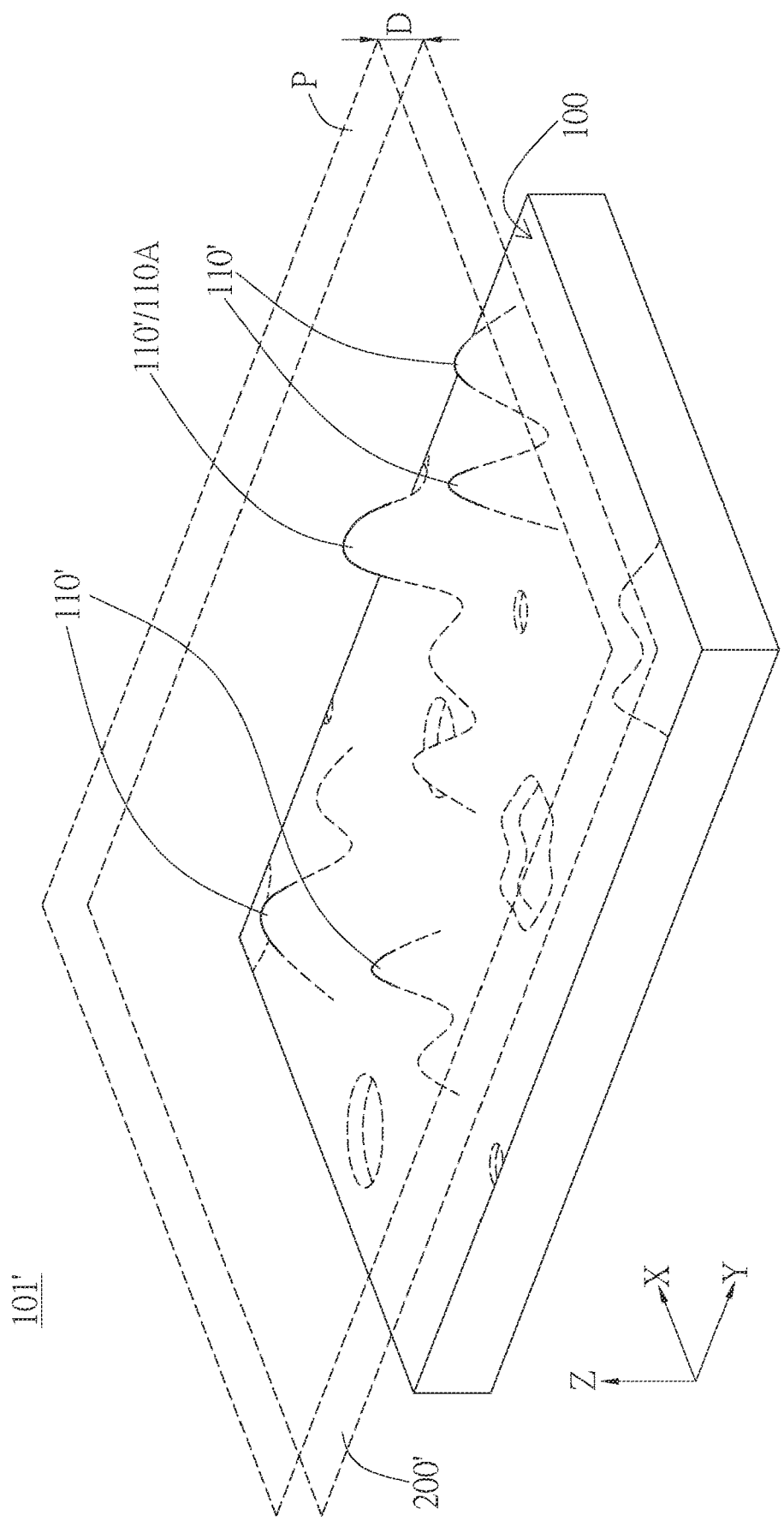
FIG. 7 is a schematic view of another embodiment of the given unit measuring area of the invention.

Referring to FIG. 7, FIG. 7 is a schematic view of another embodiment of the given unit measuring area 101' of the invention. As shown in FIG. 7, the given unit measuring area 101' has a plurality of rough structures 110'. The plurality of rough structures 110' include a highest structure 110A. The reference plane 200' can be set as the plane having the predetermined distance D from the highest point of the highest structure 110A. For example, the tangent plane at the highest point of the highest structure 110A is parallel to the XY plane and defined as a reference plane P. In this embodiment, the reference plane 200' is the plane at a distance of 1 µm below the reference plane P (i.e., D=1 µm), and the reference plane 200' is parallel to the reference plane P. When the display surface 31 of the display panel 30 is a flat plane, the reference plane 200' and the reference plane P are substantially parallel to the display surface 31. It is noted that the details of the given unit measuring area 101' and the measurements can be referred to the related descriptions of the given unit measuring area 101 of FIG. 3, and will not elaborate again. FIG. 7 and FIG. 3 are different in that in determining the anti-scratch ability, the measurements are performed on the rough structures 110' above the reference plane 200' (as indicated by solid lines), and the structures below the reference plane 200' are considered flat (as indicated by dotted lines).

In an embodiment, the measurements are performed by an interval of 1 degree, i.e., neglecting the 0 degree which is considered flat, the area proportion of the structures above the reference plane 200' are measured for angle of 1 degree or more. Among the rough structures 110' within a range of the predetermined distance D (e.g. 1 µm) below the highest point of the highest structure 110A, a projection area of the virtual measuring planes having the angle θ larger than 27 degrees is less than 18% of the projection area of the given unit measuring area 101' on the reference plane 200', and within the range of the predetermined distance D (e.g. 1 µm) below the highest point of the highest structure 110A, a projection area of the rough structures 110' is equal to or larger than 30% of the projection area of the given unit measuring area 101' on the reference plane 200'. In other words, for the topography of the rough structures within the range of 1 µm below the highest point of the highest structure, among the plurality of virtual measuring planes constituted by the plurality of measuring points, the projection area of the virtual measuring planes having the angle θ larger than 27 degrees is less than 18% of the projection area of the given unit measuring area 101' on the reference plane 200', such as smaller than 92.2 µm×69.1 µm×18%, and the projection area of the rough structures 110' above the reference plane 200' (indicated by solid lines) is equal to or larger than 30% of the projection area of the given unit measuring area 101' on the reference plane 200', such as equal to or larger than 92.2 µm×69.1 µm×30%. As such, it is ensured that the optical film has fewer structures of larger tilt angle and more support structures within a range that affects the anti-scratch performance, so that the anti-scratch effect can be promoted.

Figure 8:
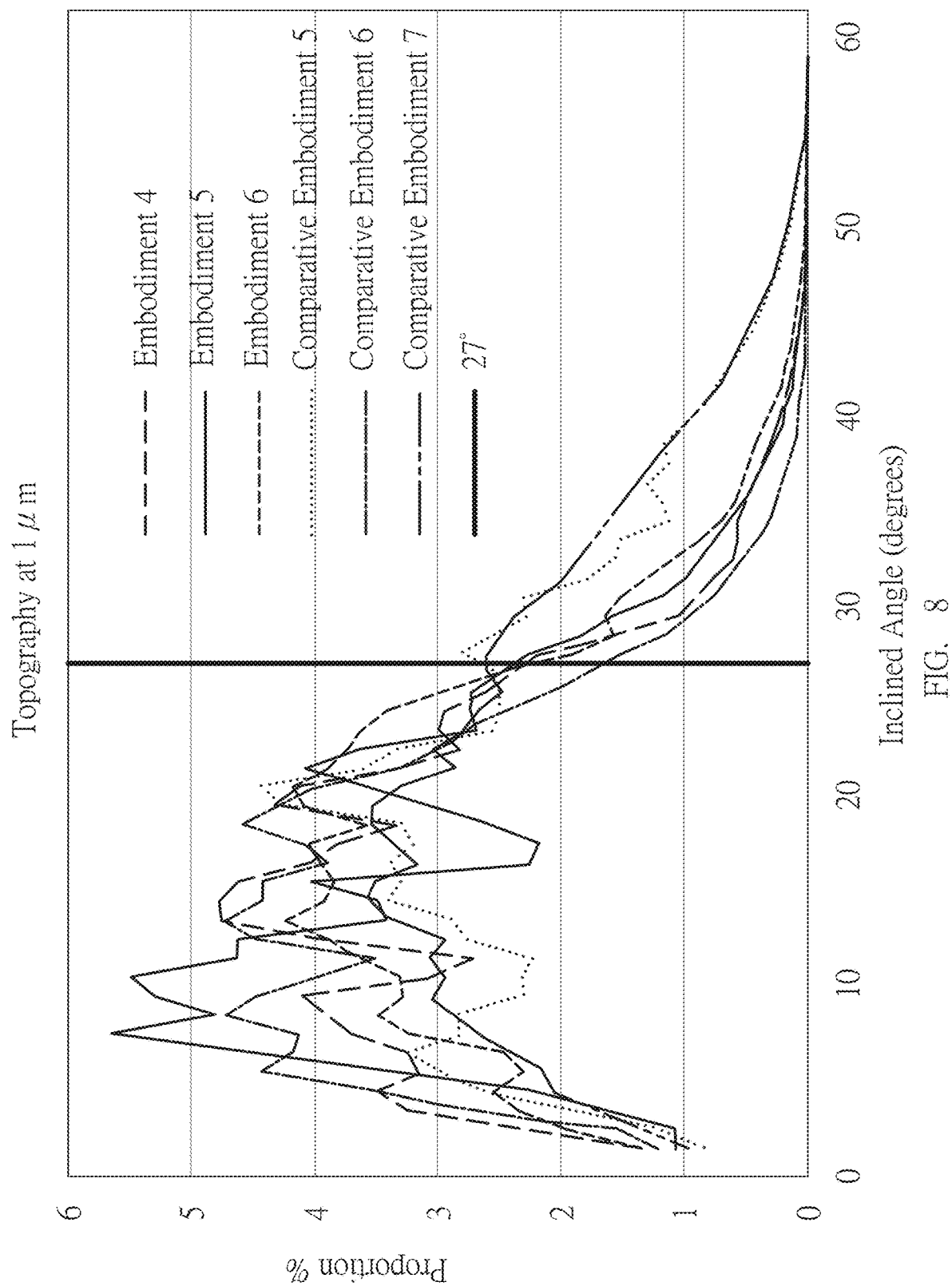
FIG. 8 is a schematic diagram showing the area proportion for structures of different inclined angles at the support surface of different embodiments and comparative embodiments.

Referring to Table 4, Table shows the test results of another three embodiments and three comparative embodiments. In Embodiments 4-6, the rough surface in the given unit measuring area has the following features: (1) on the reference plane, the projection area of the virtual measuring planes having the (tilt) angle larger than 20 degrees ranges from 31% to 60% of the projection area of the given unit measuring area, (2) the projection area of the virtual measuring planes having the (tilt) angle larger than 50 degrees is less than 7% of the projection area of the given unit measuring area, and (3) 25% of the measuring points has the height larger than the first height, 75% of the measuring points has the height larger than a second height, and the height difference (e.g. Rδc) between the first height and the second height is equal to or larger than 0.6 µm and smaller than or equal to 2.5 µm. After the test of human factors, the optical films of Embodiments 4-6 having the rough surface designed as above can effectively destroy the shape of light spots and achieve a good anti-glare performance. Referring to Table 4 and FIG. 8, FIG. 8 is a schematic diagram showing the area proportion for structures of different inclined angles at the support surface of different embodiments and comparative embodiments, wherein Comparative Embodiments 5-7 are used for comparison of anti-scratch ability. In the anti-scratch tests, in Embodiments 4-6, the support surface (topography within the range of 1 µm below the highest structure) has the following features: (4) the projection area of the virtual measuring planes having the angle larger than 27 degrees is less than 18% of the projection area of the given unit measuring area on the reference plane, and (5) the projection area of the rough structures is equal to or larger than 30% of the projection area of the given unit measuring area on the reference plane. After the test of human factors, the optical films of Embodiments 4-6 designed with the above features (4)-(5) can effectively reduce the structures of larger tilt angle in the support surface and increase the support, so that the anti-scratch ability can be achieved to the pencil hardness of 7H or more (e.g. 8H or 9H). In Comparative Embodiment 5, the structures of larger tilt angle in the support surface is too much, impairing the anti-scratch ability. In Comparative Embodiment 6, the projection area of the rough structures is less than 30% on the support surface, resulting in insufficient support that affects the anti-scratch ability. In Comparative Embodiment 7, the structures of larger tilt angle in the support surface is too much, and the projection area of the rough structures is less than 30% on the support surface, resulting in insufficient support that affects the anti-scratch ability.

TABLE 4

| | Marco Inspection | | Surface Data (150X) | | | Surface Data at 1 µm (150X, D = 1 µm) | |
|---|---|---|---|---|---|---|---|
| | Anti-Scratch | Anti-Glare | angle >20 (%) | angle >50 (%) | Rδc (µm) | >27 angle (%) | Area proportion (%) |
| Embodiment 4 | >9 H | ○ | 31.5 | 0.01 | 0.6 | 17.8 | 40.2 |
| Embodiment 5 | 8 H | ○ | 36.2 | 0.02 | 0.6 | 15.7 | 44.0 |
| Embodiment 6 | 8 H | ○ | 35.2 | 0.03 | 0.7 | 14.1 | 32.0 |

TABLE 4-continued

| | Marco Inspection | | Surface Data (150X) | | | Surface Data at 1 μm (150X, D = 1 μm) | |
|---|---|---|---|---|---|---|---|
| | Anti-Scratch | Anti-Glare | angle >20 (%) | angle >50 (%) | Rδc (μm) | angle >27 (%) | Area proportion (%) |
| Comparative Embodiment 5 | 6 H | — | — | — | — | 26.6 | 53.8 |
| Comparative Embodiment 6 | 6 H | — | — | — | — | 7.3 | 26.4 |
| Comparative Embodiment 7 | 6 H | — | — | — | — | 28.2 | 15.0 |

Figure 9A:
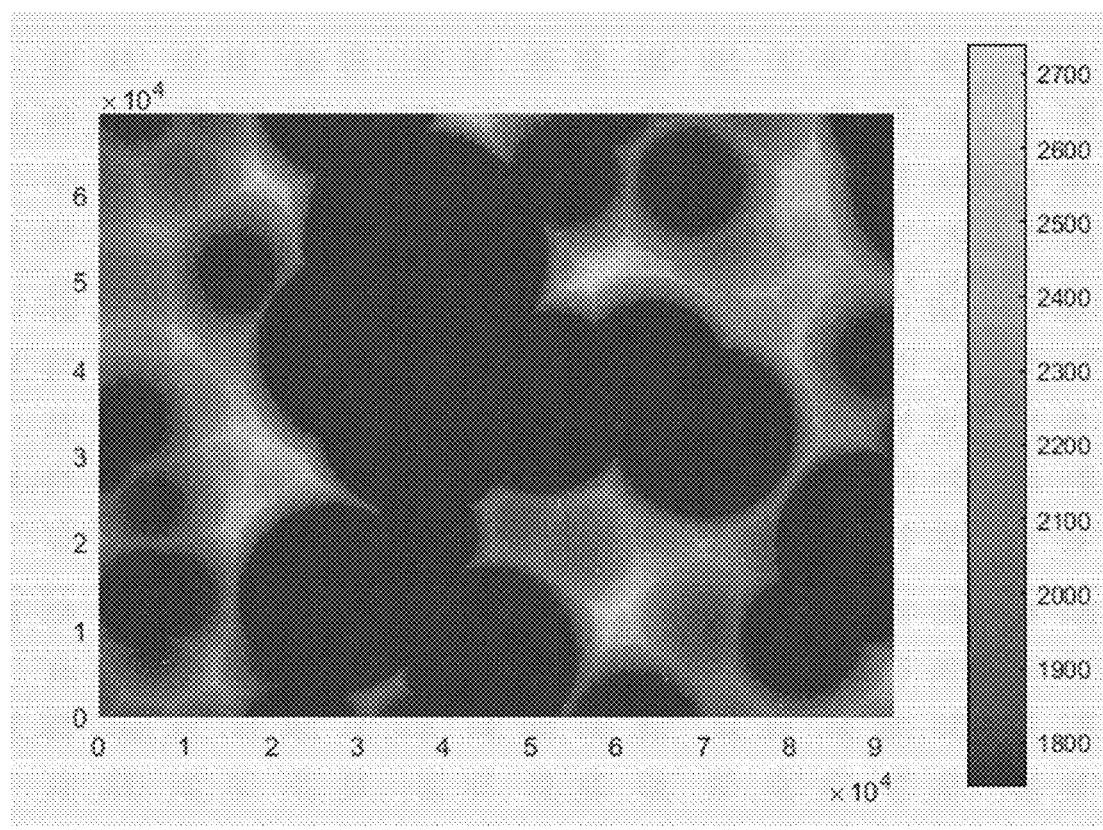
FIG. 9A and FIG. 9B are simulation diagrams of the topography analysis of an exemplary embodiment and a comparative embodiment, respectively.
Figure 9B:
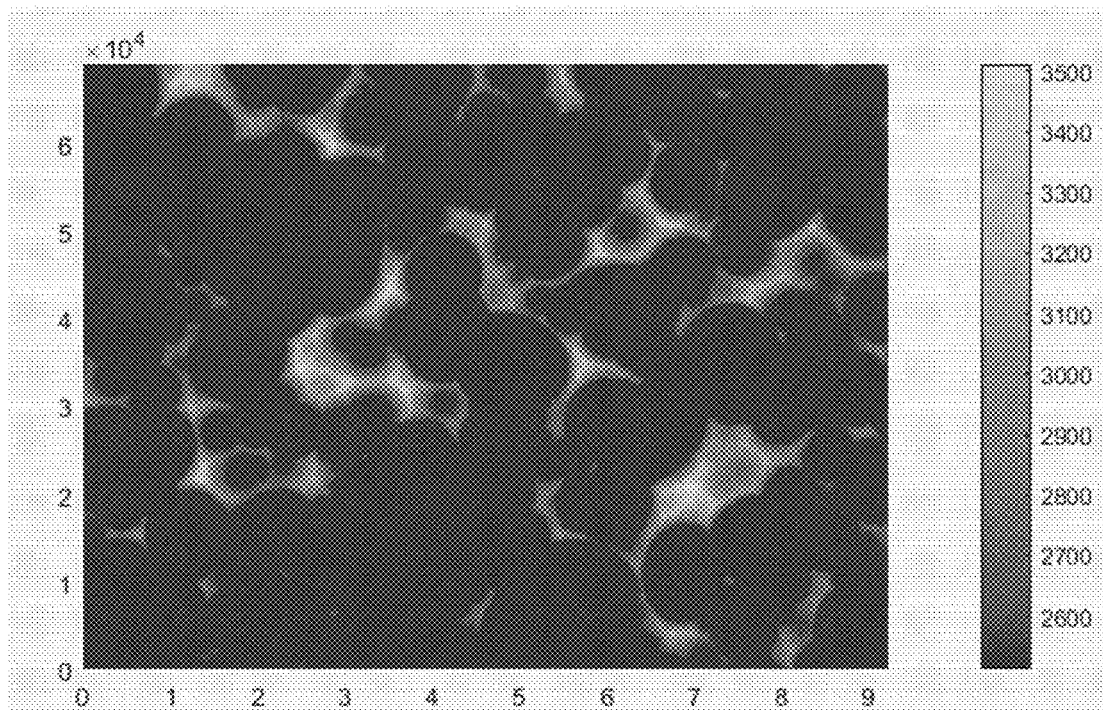

Referring to FIG. 9A and FIG. 9, FIG. 9A and FIG. 9B are simulation diagrams of the topography analysis of Embodiment 4 and Comparative Embodiment 7, respectively. In an embodiment, by setting parameters of the laser scanning microscope (e.g. Keyence, VK-X200), such as Rmr(c), to analyze the topography within 1 μm (c=1 μm) from the highest point of the highest structure 110A, the simulation diagrams shown in FIG. 9A and FIG. 9B can be obtained. In the drawings of FIG. 9A and FIG. 9B, the dark blue area represents that the structures below the reference plane 200' (e.g. below 1 μm or more from the highest point of the highest structure 110A) are considered flat. It can be seen from FIG. 9A and FIG. 9B that Embodiment 4 has more support to provide a better anti-scratch effect, and Comparative Embodiment 7 has little amount of support to impair the anti-scratch ability and is easy to be damaged. In other words, the optical films of Embodiments 4-6 exhibit a good anti-glare performance and a good anti-scratch effect and are suitable for use in touch and non-touch display modules, while the optical films of Comparative Embodiments 5-7 have the anti-scratch ability less than a pencil hardness of 7H and are suitable for non-touch display modules.

Figure 10:
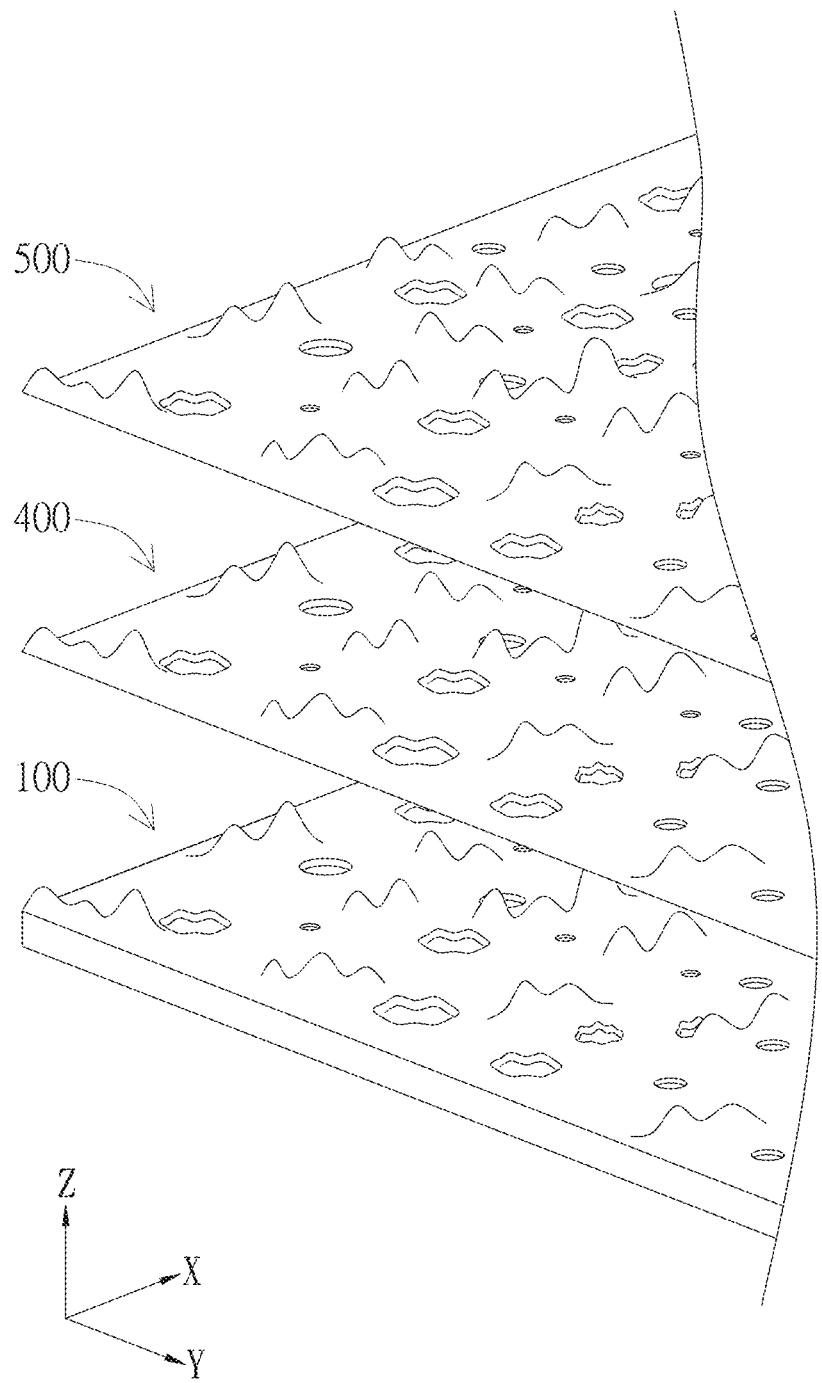
FIG. 10 is a partially enlarged view of yet another embodiment of the optical film of the invention.

As shown in FIG. 10, in another embodiment, the optical film can further include an anti-fingerprint film 500 disposed on the anti-reflective layer 400. The anti-fingerprint film 500 can be made of hydrophobic/oleophobic materials and formed on the anti-reflective layer 400 by coating, plating, or any suitable processes, so as to avoid contaminants and protect the optical film.

Although the preferred embodiments of the present invention have been described herein, the above description is merely illustrative. The preferred embodiments disclosed will not limit the scope of the present invention. Further modification of the invention herein disclosed will occur to those skilled in the respective arts and all such modifications are deemed to be within the scope of the invention as defined by the appended claims.

What is claimed is:

1. An optical film, comprising:
a rough surface defining a reference plane, in a given unit measuring area, the rough surface having a plurality of measuring points constituting a plurality of virtual measuring planes, a normal to each of the virtual measuring planes having an angle included with a normal to the reference plane, each of the measuring points having a height from the reference plane,
wherein on the reference plane, a projection area of the virtual measuring planes having the angle larger than 20 degrees ranges from 31% to 60% of a projection area of the given unit measuring area, and a projection area of the virtual measuring planes having the angle larger than 50 degrees is less than 7% of the projection area of the given unit measuring area,
wherein 25% of the measuring points has the height larger than a first height, 75% of the measuring points has the height larger than a second height, and the height difference between the first height and the second height is equal to or larger than 0.6 μm and smaller than or equal to 2.5 μm.

2. The optical film of claim 1, wherein the given unit measuring area has a plurality of rough structures; the plurality of rough structures comprises a highest structure; within a range of 1 μm below the highest structure, a projection area of the virtual measuring planes having the angle larger than 27 degrees is less than 18% of the projection area of the given unit measuring area on the reference plane; within the range of 1 μm below the highest structure, a projection area of the rough structures is equal to or larger than 30% of the projection area of the given unit measuring area on the reference plane.

3. The optical film of claim 2, wherein the given unit measuring area is an area of 92.2 μm×69.1 μm, and the number of the measuring points is 1024×768.

4. The optical film of claim 2, further comprising an anti-reflective layer disposed on the rough surface.

5. The optical film of claim 4, further comprising an anti-fingerprint film disposed on the anti-reflective layer.

6. The optical film of claim 1, wherein the given unit measuring area is an area of 92.2 μm×69.1 μm, and the number of the measuring points is 1024×768.

7. The optical film of claim 1, further comprising an anti-reflective layer disposed on the rough surface.

8. A display module, comprising:
a display panel having a display surface; and
an optical film disposed on the display panel with a rough surface away from the display surface,
wherein the rough surface defines a reference plane; in a given unit measuring area, the rough surface has a plurality of measuring points constituting a plurality of virtual measuring planes; a normal to each of the virtual measuring planes has an angle included with a normal to the reference plane; each of the measuring points has a height from the reference plane,
wherein on the reference plane, a projection area of the virtual measuring planes having the angle larger than 20 degrees ranges from 31% to 60% of a projection area of the given unit measuring area, and a projection area of the virtual measuring planes having the angle larger than 50 degrees is less than 7% of the projection area of the given unit measuring area,
wherein 25% of the measuring points has the height larger than a first height, 75% of the measuring points has the height larger than a second height, and the height difference between the first height and the second height is equal to or larger than 0.6 μm and smaller than or equal to 2.5 μm.

9. The display module of claim 8, wherein the given unit measuring area has a plurality of rough structures; the plurality of rough structures comprises a highest structure; within a range of 1 μm below the highest structure, a projection area of the virtual measuring planes having the angle larger than 27 degrees is less than 18% of the projection area of the given unit measuring area on the reference plane; within the range of 1 μm below the highest structure, a projection area of the rough structures is equal to or larger than 30% of the projection area of the given unit measuring area on the reference plane.

10. The display module of claim 9, wherein the given unit measuring area is an area of 92.2 μm×69.1 μm, and the number of the measuring points is 1024×768.

11. The display module of claim 9, further comprising an anti-reflective layer disposed on the rough surface.

12. The display module of claim 11, further comprising an anti-fingerprint film disposed on the anti-reflective layer.

13. The display module of claim 8, wherein the given unit measuring area is an area of 92.2 μm×69.1 μm, and the number of the measuring points is 1024×768.

14. The display module of claim 8, further comprising an anti-reflective layer disposed on the rough surface.

15. The display module of claim 8, wherein the reference plane is substantially parallel to the display surface.

\* \* \* \* \*